(12) United States Patent
Azenkot et al.

(10) Patent No.: US 9,954,547 B1
(45) Date of Patent: Apr. 24, 2018

(54) HIGH FREQUENCY DIGITAL-TO-ANALOG CONVERSION BY TIME-INTERLEAVING WITHOUT RETURN-TO-ZERO

(71) Applicant: MACOM Connectivity Solutions, LLC.

(72) Inventors: Yehuda Azenkot, San Jose, CA (US); Nanda Govind Jayaraman, Santa Clara, CA (US)

(73) Assignee: MACOM Connectivity Solutions, LLC, Santa Clara, CA (US)

( * ) Notice: Subject to any disclaimer, the term of this patent is extended or adjusted under 35 U.S.C. 154(b) by 0 days.

(21) Appl. No.: 15/668,470

(22) Filed: Aug. 3, 2017

(51) Int. Cl.
   *H03M 1/66* (2006.01)
   *H03M 1/12* (2006.01)
   *G11C 27/02* (2006.01)
   *H03D 7/16* (2006.01)
   *H03M 1/82* (2006.01)
   *H03M 1/00* (2006.01)
   *H03M 1/74* (2006.01)
   *H03K 5/135* (2006.01)

(52) U.S. Cl.
   CPC ........... *H03M 1/128* (2013.01); *G11C 27/026* (2013.01); *H03D 7/165* (2013.01); *H03K 5/135* (2013.01); *H03M 1/002* (2013.01); *H03M 1/662* (2013.01); *H03M 1/747* (2013.01); *H03M 1/825* (2013.01)

(58) Field of Classification Search
   CPC ...... H03M 1/74; H03M 1/662; H03M 1/0665; H03M 3/502; H03M 3/50; H03M 1/687; H03M 1/70; H03M 3/506

USPC ................................ 341/118, 120, 144, 145
See application file for complete search history.

(56) References Cited

U.S. PATENT DOCUMENTS

| | | | | |
|---|---|---|---|---|
| 5,225,835 A * | 7/1993 | Majima | ................... | H03M 3/35 341/131 |
| 5,818,372 A * | 10/1998 | Noro | ................... | H03M 1/0641 341/118 |
| 6,583,742 B1 * | 6/2003 | Hossack | ............. | H03M 1/0668 341/143 |
| 7,312,737 B2 | 12/2007 | Jungerman et al. | | |
| 7,941,686 B2 | 5/2011 | Fujisawa et al. | | |
| 7,969,340 B2 * | 6/2011 | Lou | ..................... | H03M 7/3033 341/143 |
| 8,218,969 B2 | 7/2012 | Forghieri et al. | | |
| 8,659,453 B1 | 2/2014 | Low et al. | | |

(Continued)

*Primary Examiner* — Linh Nguyen

(57) ABSTRACT

An interleaved DAC configured to generate a set of second digital inputs responsive to a set of first digital inputs. Each second digital input is obtained by subtracting the other second digital inputs in the set from the corresponding first digital input. Two consecutive first digital inputs are shifted by a phase of $T=1/f_s$. The second digital inputs are supplied to a set of sub-DACs arrange in parallel. Each sub-DAC operates at a frequency of $f_s/R$, and drives an analog output responsive to each second digital input for a duration of R×T. Clock signals used by two sub-DACs for converting two consecutive second digital inputs are offset by a phase of T. In each interval of T, summation of the analog signals output from the set of sub-DACs produces an analog value of a single first digital input, thereby achieving a data conversion speed of $f_s$.

20 Claims, 12 Drawing Sheets

(56) References Cited

U.S. PATENT DOCUMENTS

| | | | | |
|---|---|---|---|---|
| 2002/0063647 A1* | 5/2002 | Brooks | ................ | H03M 1/067 341/144 |
| 2003/0112166 A1* | 6/2003 | Al-Awadhi | ............ | H03M 3/50 341/143 |
| 2004/0061634 A1* | 4/2004 | Morimoto | ............ | H03M 3/372 341/144 |
| 2005/0052301 A1* | 3/2005 | Mills | ................... | H03M 1/0643 341/144 |
| 2005/0062630 A1* | 3/2005 | Lin | .................... | H03M 1/0665 341/144 |
| 2005/0225472 A1* | 10/2005 | Schoner | ............... | H03M 3/368 341/166 |
| 2009/0243904 A1* | 10/2009 | Lee | .................... | H03M 1/0673 341/144 |
| 2014/0152480 A1* | 6/2014 | Nguyen | ................. | H03M 1/66 341/144 |

\* cited by examiner

|  | | | | | | | | | | | | |
|---|---|---|---|---|---|---|---|---|---|---|---|---|
| DAC 1 | x1 | x1 | x1 | x1 | x1 | x1 | x6 | x6 | x6 | x6 | x6 | x11 |
| DAC 2 |  | x2 | x2 | x2 | x2 | x2 | x2 | x7 | x7 | x7 | x7 | x7 |
| DAC 3 |  |  | x3 | x3 | x3 | x3 | x3 | x3 | x8 | x8 | x8 | x8 |
| DAC 4 |  |  |  | x4 | x4 | x4 | x4 | x4 | x4 | x9 | x9 | x9 |
| DAC 5 |  |  |  |  | x5 | x5 | x5 | x5 | x5 | x5 | x10 | x10 |
| DAC 6 |  |  | -x1 | -x1 | -x1 | -x1 | -x5 | -x5 | -x5 | -x5 | -x9 | -x9 |
| DAC 7 |  |  |  | -x2 | -x2 | -x2 | -x2 | -x6 | -x6 | -x6 | -x6 | -x10 |
| DAC 8 |  |  |  |  | -x3 | -x3 | -x3 | -x3 | -x7 | -x7 | -x7 | -x7 |
| DAC 9 |  |  |  |  |  | -x4 | -x4 | -x4 | -x4 | -x8 | -x8 | -x8 |
| Sum of 9 DACs | x1 | x2 | x3 | x4 | x5 | x6 | x7 | x8 | x9 | x10 | x11 |  |

FIG. 5

HIGH FREQUENCY DIGITAL-TO-ANALOG CONVERSION BY TIME-INTERLEAVING WITHOUT RETURN-TO-ZERO

CROSSREFERENCE

This application is related to the co-pending commonly-assigned U.S. patent application Ser. No. 15/616,490, filed on Jun. 7, 2017, entitled "HIGH FREQUENCY DIGITAL-TO-ANALOG CONVERSION BY INTERLEAVING WITHOUT RETURN-TO-ZERO."

TECHNICAL FIELD

Embodiments of the present disclosure relate generally to the field of signal processing in communications and, more specifically, to the field of digital-to-analog conversion in signal processing.

BACKGROUND OF THE INVENTION

Digital-to-Analog Converters (DACs) are commonly employed in state-of-the art network communication paths to convert base-band and intermediate-frequency (IF) data from the digital to analog domains. With the ever-increasing data transmission rates and bandwidths in network communication technologies, high-speed, high-precision DACs have become more and more important for achieving desired performances of a wide range of components in a network system. However, it has been challenging to develop DACs that can satisfy the requirements of high frequency systems, such as the 112 GHz systems.

FIG. 1 illustrates an example of a conventional DAC 100 in accordance with the prior art. A single DAC 100 is configured to operate in the full desired Digital-to-Analog (D/A) conversion rate and covert the digital input 101 (e.g., 8 bits digital data) to an analog output 103. As shown in diagram 110, the clock signal 102 to the DAC 100 has the same frequency as the desired data conversion rate ($f_s$). For each digital input 101, a full clock cycle T ($=1/f_s$) is needed for the DAC 100 to accomplish D/A conversion. However, it is difficult to implement such a DAC to high speeds (e.g., 112 GHz) due to the fundamental limitations of the particular technology nodes, e.g., 28 nm, 16 nm, and 7 nm, etc.

One way to scale up DAC speed is to interleave lower speed sub-DACs to add up to a high speed data output. FIG. 2 illustrates an example of a conventional interleaved DAC 200 in accordance with the prior art. In this example, for obtaining an overall data conversion rate $f_s$ of 112 GHz, the interleaved DAC 200 includes 4 parallel sub-DACs 211-214, each sub-DAC having a clock (CLK) frequency of 28 GHz ($=f_s/4$). As shown in diagram 220, the clock signal of a respective sub-DAC is shifted by a clock phase of 90° from that of the preceding sub-DAC. The analog outputs 221-224 of the sub-DACs 211 are combined to produce a resultant analog output 231, e.g., they are simply connected together.

To provide the analog outputs from the 4 sub-DACs 211-214 separately and successively in the resultant analog output 231, the clock for each sub-DAC does not have the ON pulse overlap with the ON pulse of the remaining sub-DACs' clocks. Thus, at any given point in time, only one sub-DAC drives the output at 231. As shown in the clock timing diagrams 220, the pulse width of each clock (CLK1-CLK4) extends only for a $T=1/112$ GHz, and the analog output of the sub-DAC drops to zero at the end of T, the so-called "return-to-zero" technique. Unfortunately, the difficulties in accomplishing a conversion by a sub-DAC in such a narrow pulse width do not ease up the implementation of individual sub-DACs even if 10 or 100 more interleaved sub-DACs are used.

SUMMARY OF THE INVENTION

Accordingly, disclosed herein are embodiments directed to time-interleaved digital-to-analog converter (DACS) that offer high conversion speeds yet with reduced speed requirements for sub-DACs.

In one aspect, embodiments of the present disclosure presented herein provide an interleaved DAC including N positive sub-DACs and N−1 negative sub-DACs, where N is an integer greater than 1. Each positive sub-DAC is driven by a clock frequency of $f_s/N$, and each negative sub-DAC is driven by a clock frequency of $f_s/(N-1)$. Each digital input is provided to both a positive sub-DAC and a negative sub-DAC for conversion, with the clock signal of the negative sub-DAC being delayed by a phase of $T=1/f_s$ compared with that of the positive sub-DAC. Responsive to a same digital input, the positive sub-DAC produces a positive analog output, and the negative sub-DAC produces a negative analog output of the same magnitude. Further, the clock signals for two positive sub-DACs configured to convert two consecutive digital inputs are offset by the phase of $T=1/f_s$; and the clock signals for two negative sub-DACs configured to convert two consecutive digital inputs are offset by the same phase of $T=1/f_s$.

Responsive to a digital input, each positive sub-DAC operates to perform the conversion and drive its analog output for a duration of $N \times T = N/f_s$; and each negative sub-DAC operates to drive its analog output responsive to a digital input for a duration of $(N-1) \times T = (N-1)/f_s$. Thus, the positive sub-DAC drives a data point for a duration $N \times T$, during which time the negative sub-DAC removes this data unit for a duration of $(N-1) \times T$. As such, by combining the analog outputs of both sets of sub-DACs, a particular output from a positive sub-DAC is removed by subtraction from the combined analog output when it is no longer needed at the output. As a result, the combined analog output has each data point valid only for a duration of T and then the next data point emerges, thereby achieving the desired data conversion speed of $f_s=1/T$.

In another aspect of the present disclosure, embodiments of the present disclosure provide an interleaved DAC configured to generate a set of second digital inputs responsive to a set of first digital inputs, where each second digital input is obtained by subtracting the other second digital inputs in the set from its corresponding first digital input. The set of first digital inputs may be generated by demultiplexing a digital input signal. Two first digital inputs corresponding to two consecutive data points in the digital input signal are shifted by a phase of $T=1/f_s$. Each second digital input is shifted by a phase of T from its corresponding first digital input. The second digital inputs are supplied to a set of sub-DACs ("first sub-DACs," including R parallel sub-DACs) and converted to analog signals. Each first sub-DAC operates at a frequency of $f_s/R$, and drives an analog output responsive to each second digital input for a duration of $R \times T$ ($f_s=1/T$). The clock signals used by two sub-DACs for converting second digital inputs of two consecutive data points in the digital input signal are offset by a phase of $T=1/f_s$. In each interval of T, summation of the analog signals output from the set of sub-DACs produces the analog value of a single first digital input or a single data point in the digital input signal. Thus, a desired data conversion speed of $f_s=1/T$ can be achieved.

In some embodiments, to prevent an input to a first sub-DAC from becoming too large, a modulo of M (e.g., $M=2^n$, where n is the input bit width of a first sub-DAC) is applied on each subtraction result that is obtained by subtracting the other second digital inputs in the set from a first digital input. The remainder of the modulo operation is supplied as the corresponding second digital input. Thereby, the quotient portions are thereby omitted from conversion by the first sub-DACs. In this manner, each second digital input can be advantageously maintained within the input limit to a first sub-DAC. Restoration logic is then used to compensate (or reverse) the effects of these modulo operations by adding the quotient portions back such that the resultant analog signal of the interleaved DAC represents the correct analog values of the first digital inputs.

More specifically, the restoration logic operates to produce a sum signal by summing all the second digital inputs. Modulo of M is applied to the sum signal to produce a quotient signal which is then demultiplexed into a subsets of positive digital inputs and a subset of negative digital inputs. Each positive digital input is supplied to a positive sub-DAC for conversion, and the corresponding negative digital input is supplied to a negative sub-DAC for conversion. The clock signal of a positive sub-DAC is delayed by a phase of $T=1/f_s$ compared with that of the corresponding negative sub-DAC. Responsive to a same data point in the quotient signal, the negative sub-DAC produces a negative analog output, and the positive sub-DAC produces a positive analog output of the same magnitude. Further, the clock signals for two positive sub-DACs configured to convert two consecutive digital points are offset by the phase of $T=1/f_s$; and the clock signals for two negative sub-DACs configured to convert two consecutive data points are offset by the same phase of $T=1/f_s$.

Responsive to a data point in the quotient signal, each negative sub-DAC operates in the frequency of $f_s/(R+1)$ and can perform the conversion and drive its analog output for a duration of $(R+1)\times T=(R+1)/f_s$; and each positive sub-DAC operates in the frequency of $f_s/R$ and can drive its analog output for a duration of $R\times T=R/f_s$. In effect, a negative sub-DAC drives a data point for a duration $(R+1)\times T$, during which time the corresponding positive sub-DAC removes this data point at the output of the restoration logic for a duration of $R\times T$. As such, by combining the analog outputs of both subsets of sub-DACs, a particular output from a negative sub-DAC is removed by subtraction from the combined analog output when it is no longer needed at the output of the restoration logic. As a result, the combined analog output has each data point valid only for a duration of T and then the next data point emerges, thereby achieving the desired data conversion speed of $f_s=1/T$ at the restoration logic. Further, in this configuration, the outputs of the restoration logic are synchronized with the outputs of the first sub-DACs. By combining all the outputs of the first sub-DACs, the positive sub-DACs and the negative sub-DACs, a resultant analog output of the interleaved DAC is obtained. Each data point in the resultant analog output holds for a duration of T and represents the analog value of a corresponding first digital input.

Embodiments of the present disclosure utilize interleaving DAC architecture that can advantageously overcome the fundamental limitations in scaling the traditional return-to-zero interleaving architecture. According to the present disclosure, two or more sub-DACs can be simultaneously driving output responsive to respective digital inputs. This can advantageously remove the restriction on the ON time of the clock's pulse width to be equal to $1/f_s=1/(\text{Full-rate})$, and the ON times of several sub-DACs can overlap with each other.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. Although a method may be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the Figures. Similarly, although the views in the drawings for the ease of description generally show similar orientations, this depiction in the Figures is arbitrary for the most part. Generally, the invention can be operated in any orientation.

BRIEF DESCRIPTION OF THE DRAWINGS

Embodiments of the present invention will be better understood from a reading of the following detailed description, taken in conjunction with the accompanying figures, in which like reference characters designate like elements.

FIG. 5 is a table showing the digital input schedule at the individual sub-DACs and the resultant analog signal at the combined analog output of the DAC as shown in FIG. 3.

HIGH FREQUENCY DIGITAL-TO-ANALOG CONVERSION BY TIME-INTERLEAVING WITHOUT RETURN-TO-ZERO

Overall, embodiments of the present disclosure provide interleaved DACs that can offers high conversion speeds with reduced speed requirement for sub-DACs. In one aspect of the present disclosure, an interleaved DAC utilizes a set of positive sub-DACs and a set of negative sub-DACs for converting a plurality of digital inputs in parallel. For a digital input, each positive sub-DAC can perform conversion and drive its analog output for a duration of $N \times T = N/f_s$; and each negative sub-DAC operates to drive its analog output for a duration of $(N-1) \times T = (N-1)/f_s$. The analog outputs of the two sets of sub-DACs are combined so that the output from the positive sub-DAC is removed when it is no longer needed at the output. In effect, the positive sub-DAC drives a data point for a duration $N \times T$ at the combined output, during which time the negative sub-DAC removes this data unit for a duration of $(N-1) \times T$. As a result, the combined analog signal has each data point valid only for a duration of T and then the next data point emerges, thereby achieving the desired data conversion speed of $f = 1/T$.

Although embodiments of the present disclosure are described by using a full rate of $f_s = 112$ GHz, the present disclosure is not limited to any particular frequency or frequency range, nor limited to any specific number of sub-DACs in an interleaved DAC. An interleaved DAC in accordance with the present disclosure can be implemented by using hardware logic, software logic or a combination thereof. While some embodiments described in detail herein have 5 positive and 4 negative sub-DACs, the present disclosure can be extended for use with architectures using 4 positive and 3 negative, or 6 positive and 5 negative, or 7 positive and 6 negative sub-DACs, etc.

Figure 1:
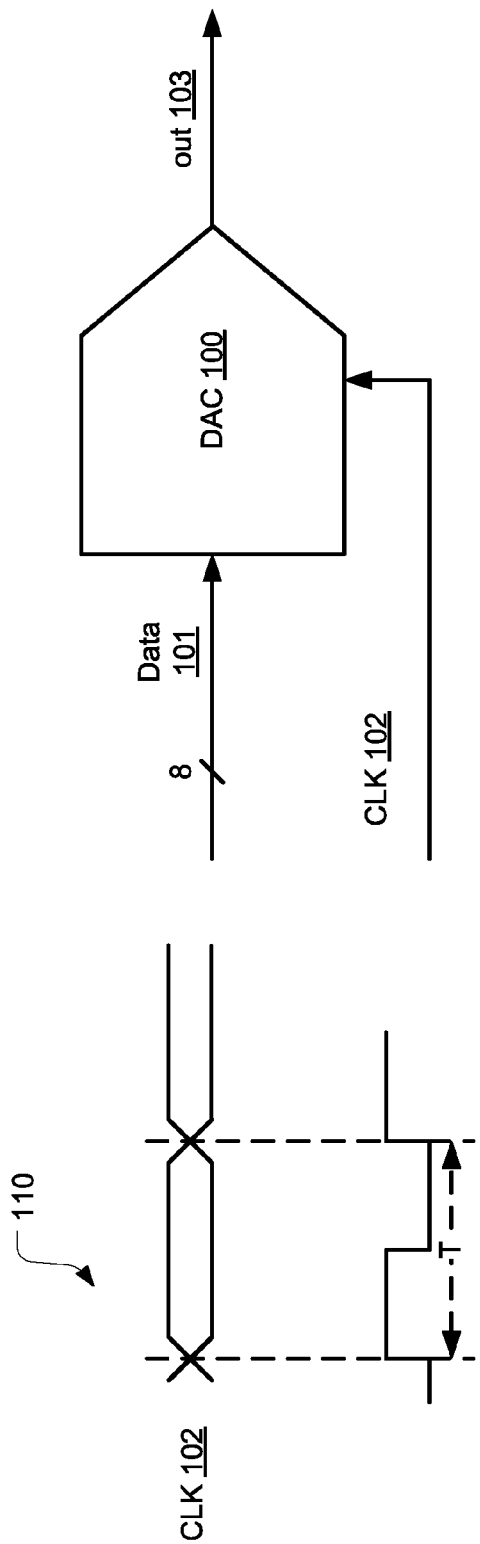
FIG. 1 illustrates an example of a conventional DAC in accordance with the prior art.
Figure 2:
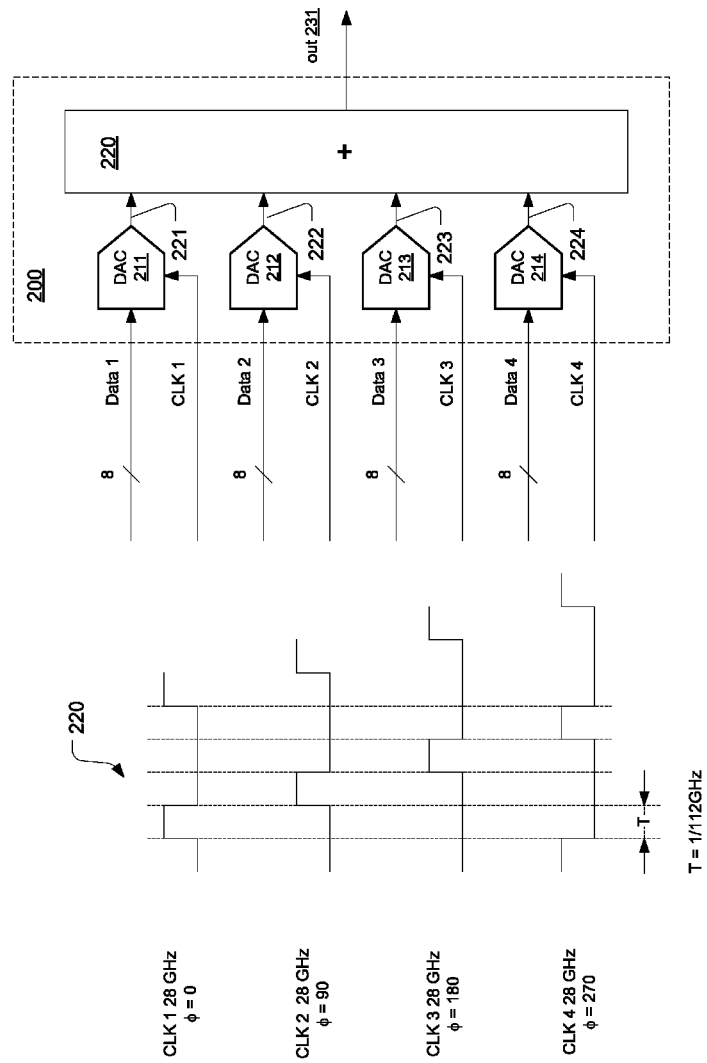
FIG. 2 illustrates an example of a conventional interleaved DAC in accordance with the prior art.
Figure 3:
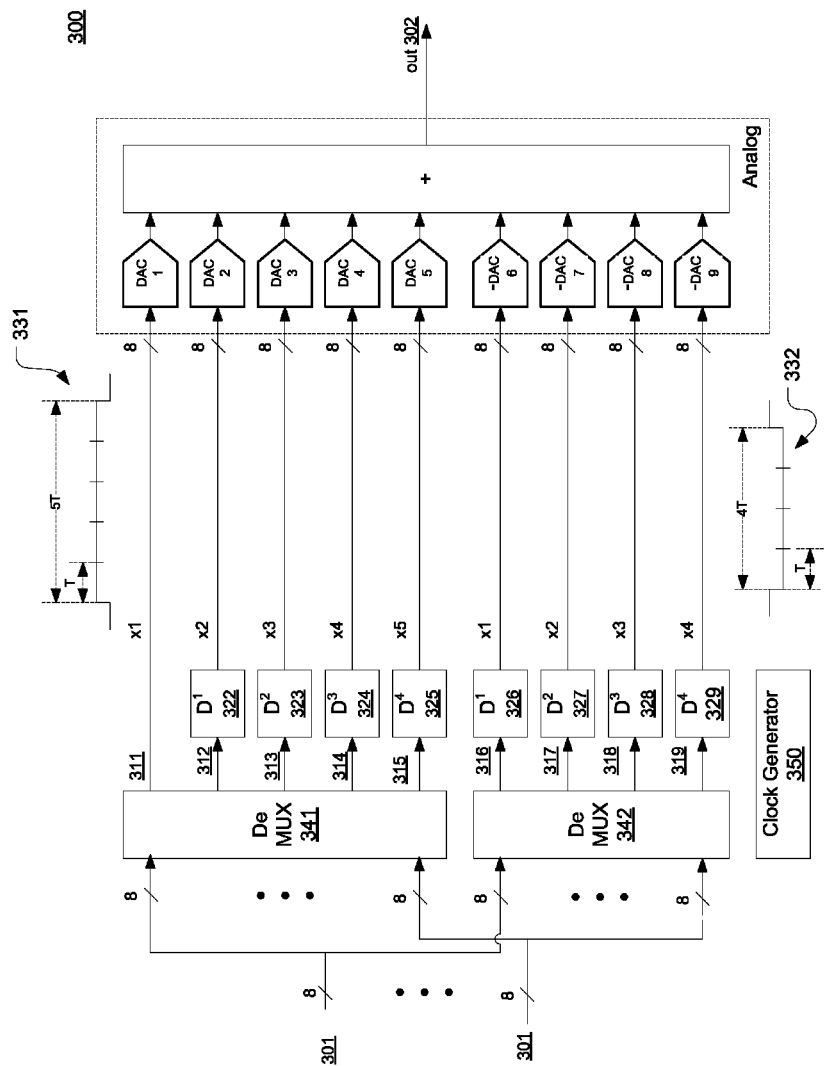
FIG. 3 illustrates the configuration of an exemplary interleaved DAC including a set of positive sub-DACs and a set of negative sub-DACs in accordance with an embodiment of the present disclosure.
Figure 4:
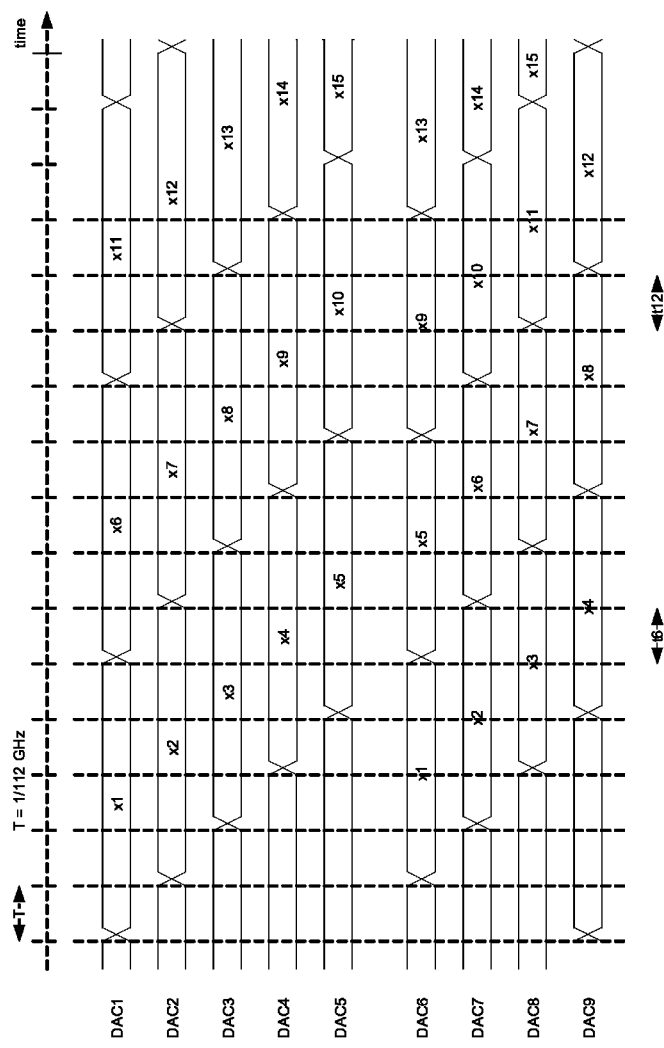
FIG. 4 illustrates the timing diagrams of the input digital inputs x1-x15 supplied to respective sub-DACs of the DAC as shown in FIG. 3.

FIG. 3 illustrates the configuration of an exemplary interleaved DAC 300 including a set of positive sub-DACs and a set of negative sub-DACs in accordance with an embodiment of the present disclosure. FIG. 4 illustrates the timing diagrams of the input digital inputs x1-x15 supplied to respective sub-DACs of the DAC 300 as shown in FIG. 3.

In this example, as shown in FIG. 3, N equals 5 and accordingly there are 5 positive sub-DACs and 4 negative sub-DACs. Each set of sub-DACs is coupled to a demultiplexer which demultiplexes a digital signal to provide digital data points 311-319. Delay units 322-329 act to add respective delays to the digital data points such that they are supplied to the corresponding sub-DACs according to a particular time schedule as shown in FIG. 4 and described in greater detail below.

The clock generator 350 supplies respective clock signals for the sub-DACs in two different frequencies. Particularly, the positive sub-DACs, DAC1 to DAC5, are driven by the clock signals with a frequency of $f_s/5$, where $f_s=112$ GHz, e.g., as shown by the exemplary clock signal 331 and FIG. 4. The negative sub-DACs, DAC6 to DAC9, are driven by the clock signals with a frequency of $f_s/4$, as shown by the exemplary clock signal 332 and FIG. 4.

The clock signals to the sub-DACs are offset in phase relative to each other. Particularly, the clock to DAC2 is delayed by $T=1/f_s$ relative to the clock to DAC1, the clock to DAC3 is delayed by T relative to the clock to DAC2, and so on. The clock signals to DAC6 starts at the same phase as the clock to DAC2, the clock to DAC7 is delayed by T relative to the clock to DAC6. The clock to DAC8 is delayed by T relative to the clock to DAC7. The clock to DAC9 is delayed by T relative to the clock to DAC8. The clock to DAC6 is delayed by T relative to the clock to DAC9, and so on.

Correspondingly, the digital inputs (e.g., x1-x5 as shown) are supplied respectively to the positive DACs DAC1-DAC5 successively with a delay T in between each two; and the digital inputs are supplied respectively to the negative DACs DAC6-DAC9 successively with a delay T in between each two.

In response to a digital input, a positive sub-DAC operating at a clock frequency of $5/f_s$ drives the conversion, and its analog outputs holds at the combined output 302, for 5T; while a negative sub-DAC operating at a clock frequency of $4/f_s$ drives the conversion, and its analog outputs holds at the combined output 302, for 4T.

In this embodiment, the outputs of all 9 sub-DACs are connected together, so the output currents are summed into the combined analog signal. Particularly, as shown in FIG. 4, the outputs of DAC1 to DAC5 are summed, and the outputs of DAC6 to DAC9 are subtracted from the sum of DAC1 to DAC5. In some embodiments, the subtraction can be achieved by connecting the negative lines of the differential outputs of DAC6 to DAC9 to the positive lines of DAC1 to DAC5.

As shown in FIG. 4, the positive sub-DACs, DAC1 to DAC5, receive clocks at the frequency of $f_s/5$, where $f_s=112$ GHz. The 5 clocks (not explicitly shown) are shifted by a phase of $T=1/112$ GHz relative to each other, so the clock to DAC2 is delayed by T relative to the clock to DAC1, and the clock to DAC3 is delayed by T relative to the clock to DAC2, and so on. The negative sub-DACs, DAC6 to DAC9, receive clocks at the frequency of $f_s/4$, where $f_s=112$ GHz. The 4 clocks (not explicitly shown) are shifted by a phase of $T=1/112$ GHz relative to each other, so the clock to DAC7 is delayed by T relative to the clock to DAC6, and the clock to DAC8 is delayed by T relative to the clock to DAC7, and so on.

FIG. 5 is a table showing the digital input schedule at the individual sub-DACs and the resultant analog signal at the combined analog output 302 of the DAC 300 as shown in FIG. 3. Each column in the table corresponds to one time period T. DAC1 gets the first digital 8-bit input x1 which extends for 5T. Then DAC2 gets the next input x2 after a delay of T for the duration of 5T. DAC3 gets the next input x3 after a delay of T relative to DAC2 input for 5T. DAC4 gets the next input x4 after a delay of T relative to DAC3 input for 5T. DAC5 receives the next input x5 after a delay of T relative to DAC4 input for 5T. Then, DAC1 receives the next input x6 after a delay of T relative to DAC5 input for 5T, and so on. Referring back to FIG. 4, these delays are added by the delay units 322-329, respectively.

The inputs to DAC6 to DAC9 are scheduled as follows. DAC6 receives the first digital 8-bit input x1 which extends for 4T. The input x1 is delayed by T relative to x1 that is input to DAC1. Then DAC7 gets the next input x2 after a delay of T relative to the DAC6 input for 4T. DAC8 gets the next input x3 after a delay of T relative to DAC7 input for 4T. DAC9 gets the next input x4 after a delay of T relative to DAC8 input for 4T. Then, DAC6 gets the next input x5 after a delay of T relative to DAC9 input for 4T. DAC7 gets the next input x6 after a delay of T relative to DAC6 input for 4T, and so on.

The output analog signal at the combined output 302 in FIG. 3, which is obtained by the summation of the 9 DACs outputs (e.g., current outputs) as shown in FIG. 5, is equivalent to the digital 8-bit inputs x1, x2, etc. For example, referring back to FIG. 4, at time t6, the combined result at the DAC output 302 can be expressed as, $$x6+x2+x3+x4+x5-(x5+x2+x3+x4)=x6;$$

and at time t12, the combined result at the DAC output 302 can be expressed as, $$x11+x12+x8+x9+x10-(x11+x8+x9+x10)=x12.$$

According to embodiments of the present disclosure, since the ON times of several sub-DACs can overlap with each other, 2 or more sub-DACs can be concurrently driving the analog output of the interleaved DAC. Hence the interleaved DAC can advantageously remove the restriction on the ON time of the clock's pulse width to be equal to $T=1/f_s=1/(\text{Full-rate})$ which is difficult to implement in practice. Thus, the interleaved DAC mechanism can advantageously remove the fundamental limitations in scaling the traditional return-to-Zero interleaving architecture.

It will be appreciated that the sub-DACs in an interleaved DAC according to the present disclosure can be implemented in any suitable manner that is well known in the art without departing from the scope of the present disclosure. The sub-DACs may be pulse-width modulator-based, oversampling DACs, binary-weighted DAC, etc. An interleaved DAC may include various other components that are well known in the art. An interleaved DAC according to the present disclosure may be used in various suitable applications, e.g., a waveform generator in a network system, data acquisition, test and measurement applications, etc.

Figure 6:
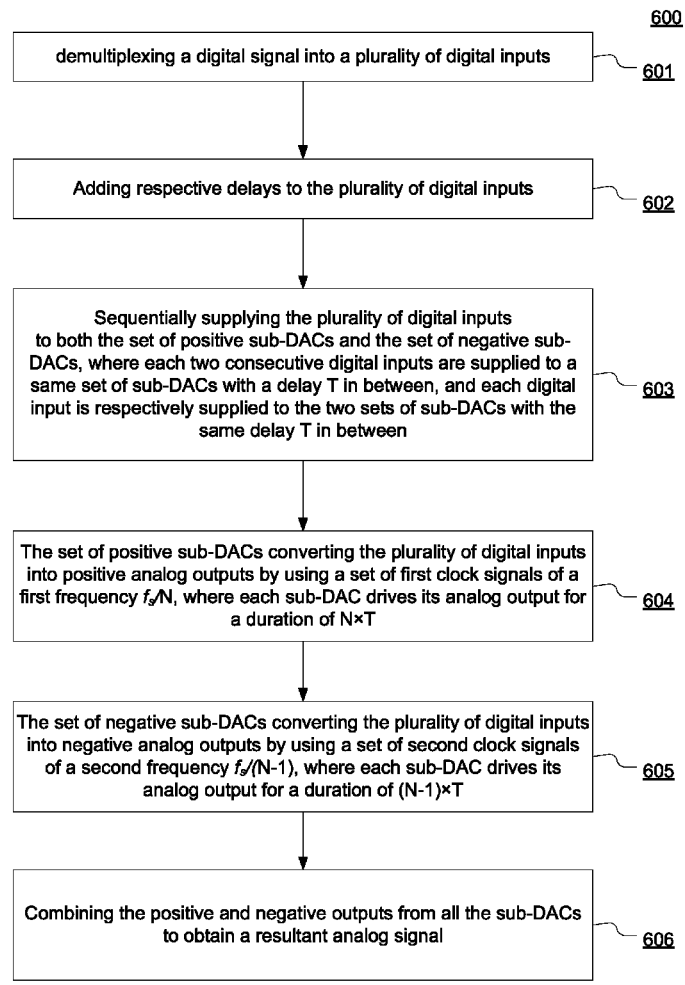
FIG. 6 is a flow chart depicting an exemplary process of converting a digital signal to an analog signal by time-interleaving sub-DACs and without return to zero in accordance with an embodiment of the present disclosure.

FIG. 6 is a flow chart depicting an exemplary process 600 of converting a digital signal to an analog signal by time-interleaving sub-DACs and without return to zero in accordance with an embodiment of the present disclosure. Process 600 may be performed by an interleaved DAC as shown in FIG. 3. However, the present disclosure is not limited to such configuration.

At 601, a digital signal is demultiplexed into a plurality of digital inputs. At 602, respective delays are added to the digital inputs by using the delay units. At 603, the plurality of digital inputs are successively supplied to the set of positive sub-DACs and the set of second sub-DACs according to an input schedule, as described in greater detail with reference to FIGS. 4 and 5. Particularly, each two consecutive digital inputs are supplied to the same set of sub-DACs with a delay T in between. For example, as shown in FIG. 4, the input x2 to DAC 2 is delayed by T relative to the input x1 to DAC1; and the input x3 to DAC3 is delayed by T relative to the input x2 to DAC2, where $T=1/f_s$, and $f_s$ is the effective data conversion rate of the interleaved DAC. For a particular digital input, it is supplied to the input of a negative sub-DAC in a delay T after it is supplied to the input of a positive sub-DAC.

At 603, the set of positive sub-DACs convert the plurality of digital inputs into positive analog outputs by using a set of first clock signals having a first frequency $f_s/N$, where N equals to the number of positive sub-DACs in the set. Each positive sub-DAC can perform conversion and drive its analog output for a duration of $N\times T=N/f_s$. At 604, in parallel with 603, the set of negative sub-DACs convert the plurality of digital inputs into negative analog outputs by using a set of clock signals having a second frequency $f_s/(N-1)$. The number of negative sub-DACs in the set equals N−1. Each negative sub-DAC operates to drive its analog output for a duration of $(N-1)\times T=(N-1)/f_s$.

The clock signals to the sub-DACs are offset in phase relative to each other. Particularly, two clock signals used for converting every two consecutive digital inputs to corresponding positive analog outputs are shifted from each other by a phase of T. Two clock signals used for converting every two consecutive digital inputs to corresponding negative analog outputs are shifted from each other by a phase of T. For each digital input, the clock signals to its positive sub-DAC and its negative sub-DAC are shifted from each other by a phase of T; and the analog output from the positive sub-DAC is an opposite value of the analog output from the negative sub-DAC, e.g., with the same magnitude but an opposite sign.

At 606, the positive analog outputs and the negative analog outputs are combined into the resultant analog output. Each analog output from a positive DAC contributes to the resultant analog output for 5T, and each analog output from a negative DAC contributes to the resultant analog output for 4T. By using the particular input schedule and the clock signal schedule as described above, the resultant analog output effectually includes a sequence of analog outputs from the positive sub-DACs in response to a sequence of digital outputs.

In another aspect of the present disclosure, embodiments of the present disclosure provide an interleaved DAC configured to generating a set of second digital inputs responsive to a set of first digital inputs, where each second digital input is obtained by subtracting the other second digital inputs in the set from its corresponding first digital input. The set of first digital inputs may be generated by demultiplexing a digital input signal. Two first digital inputs corresponding to two consecutive data points in the digital input signal are shifted by a phase of $T=1/f_s$. Each second digital input is shifted by a phase of T from its corresponding first digital input. The second digital inputs are supplied to a set of sub-DACs ("first sub-DACs," including R parallel sub-DACs) and converted to analog signals. Each first sub-DAC operates at a frequency of $f_s/R$, and drives an analog output responsive to each second digital input for a duration of R×T ($f_s=1/T$). The clock signals used by two sub-DACs for converting second digital inputs of two consecutive data points in the digital input signal are offset by a phase of $T=1/f_s$. In each interval of T, summation of the analog signals output from the set of sub-DACs produces the analog value of a single first digital input or a single data point in the digital input signal. Thus, a desired data conversion speed of $f_s=1/T$ can be achieved.

Figure 7:
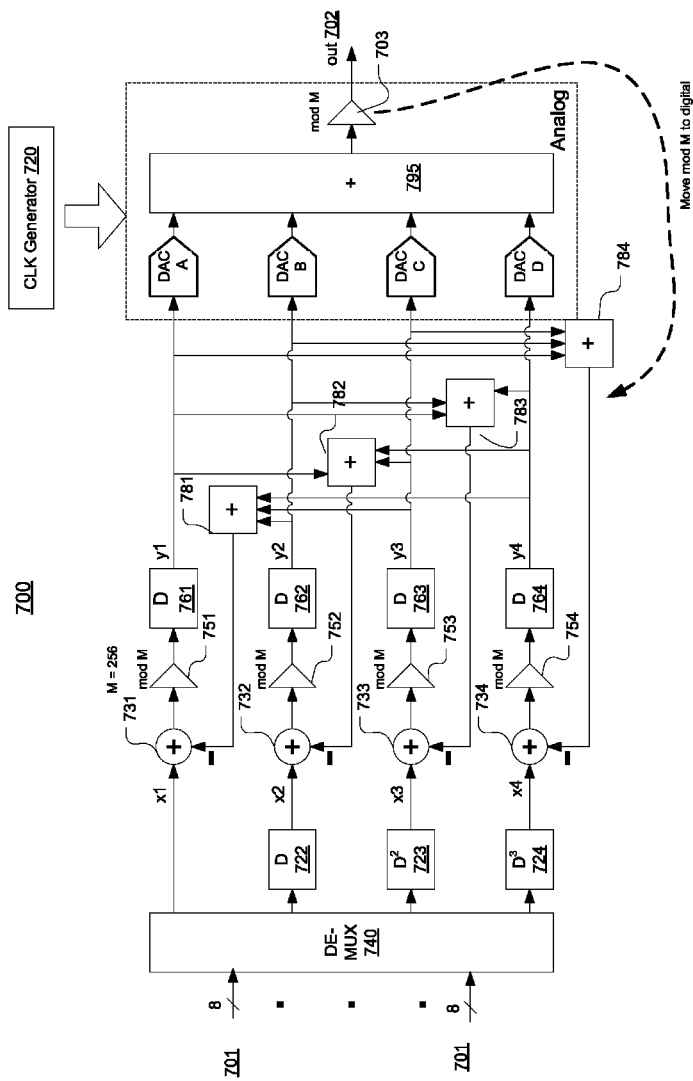
FIG. 7 illustrates the configuration of an exemplary interleaved DAC including a set of first sub-DACs in accordance with another embodiment of the present disclosure.
Figure 8:
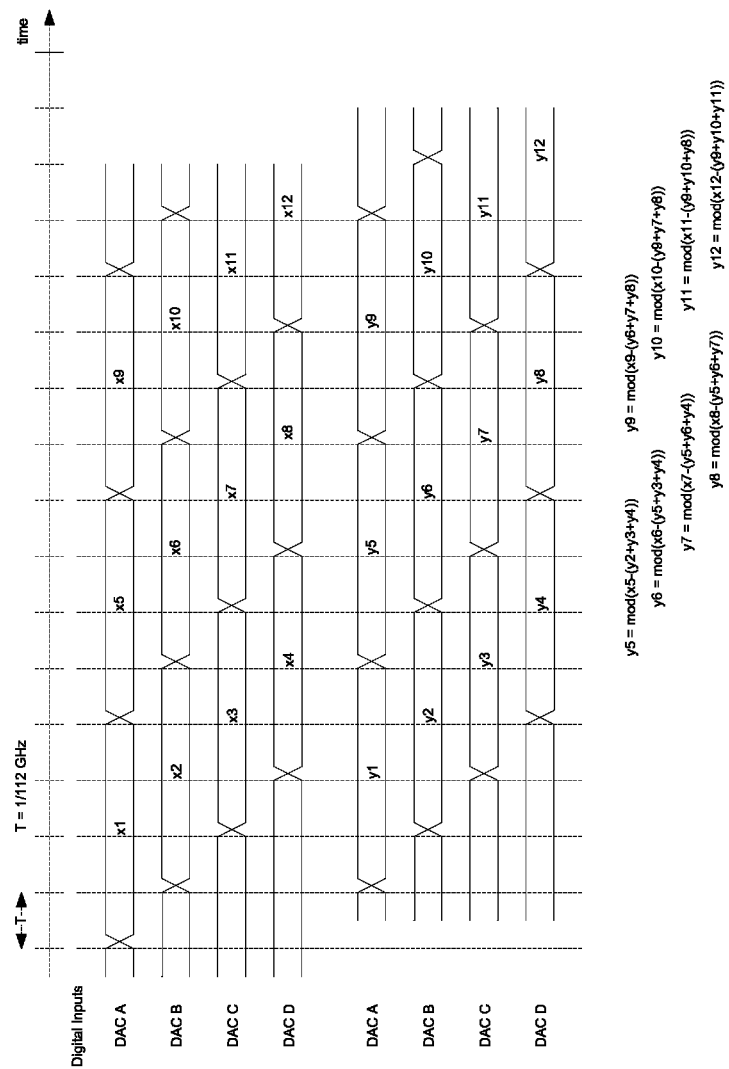
FIG. 8 illustrates the timing diagrams of the first digital inputs x1-x12 and second digital inputs y1-y12 supplied to respective first sub-DACs of the interleaved DAC as shown in FIG. 7.

FIG. 7 illustrates the configuration of an exemplary interleaved DAC 700 including a set of first sub-DACs in accordance with another embodiment of the present disclosure. FIG. 8 illustrates the timing diagrams of the first digital inputs x1-x12 and second digital inputs y1-y12 supplied to respective first sub-DACs of the interleaved DAC 700 as shown in FIG. 7.

The DAC 700 includes a demultiplexer 704, delay elements 722-724, first adders 731-734, second adders 781-784, modulo operators 751-754, delay elements 761-764, first sub-DACs arranged in parallel DAC A-DAC D, an analog output interface 795 and an analog modulo operator 703.

During operation, an input signal 701 of 8-bits is demultiplexed by the demultiplexer 740 into R (R=4 in this case) 8-bit digital signals. Each demultiplexed signal carries a sequence of data points and each data point is held for a duration of R×T in the signal. The delay units 722-724 add respective delays to the demultiplexed signals such that they are supplied to the corresponding sub-DACs, DAC A-DAC D, according to a particular time schedule as shown in FIG. 8 and described in greater detail below. Thus each 2 first digital inputs generated responsive to two consecutive data points in the digital signal 701 are offset by a phase of T, e.g., $T=1/112$ GHz. More specifically, the 8-bit digital input x2 is delayed by T relative to x1. The digital input x3 is delayed by T relative to x2. The digital input x4 is delayed by T relative to x3. The digital input x5 (in the same demultiplexed signal as x1) is delayed by T relative to x4. The digital input x6 (in the same demultiplexed signal as x2) is delayed by T relative to x5, and so on.

Each of the delay elements 761-764 adds a delay of T to the modulo outputs such that each y digital input is delayed by T in relation to the corresponding x digital input. The 4 digital signals y are supplied to the DAC A-DAC D for D/A conversion. Each y digital input (y1, y2, y3, or y4, . . . ) is generated by subtracting the other 3 y signals by using a first adder (one of 731-734) and a second adder (one of 781-784). A modulo M is applied by using a modulo operator (one of 751-754). In this case, M equals to $2^8=256$ as the x signals and the y signals are 8-bit. However, it will be appreciated that any other M values can also be used without departing from the scope of the present disclosure.

The remainders are supplied as the second digital inputs (e.g., y1-y4) to the input of DAC A-DAC D. The outputs of DAC A-DAC D are summed at 795, and the subtraction of the other y signals is then cancelled after the summation in analog. As a result, at each time slot of T, the output signal 702 is an analog signal corresponding to only a single data point in the input digital signal 701, or a single first digital input.

The clock generator 720 generates clock signals for the sub DACs, DAC A-DAC D. The clock signals to the sub-DACs are offset in phase $T=1/f_s$ relative to each other. Particularly, the clock to DAC B is delayed by T relative to the clock to DAC A, the clock to DAC C is delayed by T relative to the clock to DAC B, and so on. Correspondingly, the second digital inputs y1-y4 are supplied to DAC A-DAC D respectively and successively with a delay T in between each two y inputs that correspond to two consecutive data points in the input digital signal 701.

With the configuration as shown in FIG. 7, the data points in the digital signals y, which are the inputs to DAC A to DAC D, are processed as follows:

$$y5=\mathrm{mod}(x5-(y2+y3+y4))$$

$$y6=\mathrm{mod}(x6-(y5+y3+y4))$$

$$y7=\mathrm{mod}(x7-(y5+y6+y4))$$

$$y8=\mathrm{mod}(x8-(y5+y6+y7))$$

$$y9=\mathrm{mod}(x9-(y6+y7+y8))$$

$$y10=\mathrm{mod}(x10-(y9+y7+y8))$$

$$y11=\mathrm{mod}(x11-(y9+y10+y8))$$

$$y12=\mathrm{mod}(x12-(y9+y10+y11)), \text{ and } etc.$$

The y signals are converted to analog signals via DAC A-DAC D. Note that each y data point is fixed for 4T. But the analog output after the summation of the 4 DACs, DAC A to DAC D varies after each T, as desired.

The sum of DAC A to DAC D (in analog domain) at the first time slot T of y5 is given by:

$$y5+y2+y3+y4=\mathrm{mod}(x5-(y2+y3+y4))+y2+y3+y4$$

The modulo operator 703 is used to apply modulo on the output analog signal, the analog output thus becomes $$\mathrm{mod}(y5+y2+y3+y4)=\mathrm{mod}(\mathrm{mod}(x5-(y2+y3+y4))+y2+y3+y4)=x5$$

Thus, the analog output is equivalent to the digital input x5, as desired. However, practically speaking, implementation of modulo operator 703 in the analog domain can be difficult. Accordingly, embodiments of the present disclosure use restoration logic to accomplish equivalent modulo effect as the modulo operator 703, yet in the digital domain, by using of additional two subsets of sub-DACs, as described in greater detail with reference to FIG. 9.

The analog output signal in the next time slot T is obtained via the following process. The sum of DAC A to DAC D at the first time slot T of y6 is given by:

$$y6+y5+y3+y4=\mathrm{mod}(x6-(y5+y3+y4))+y5+y3+y4$$

If a modulo operation is applied on the analog signal, the analog output would be:

$$\mathrm{mod}(y6+y5+y3+y4)=\mathrm{mod}(\mathrm{mod}(x6-(y5+y3+y4))+y5+y3+y4)=x6$$

Thus, the analog output is equivalent to the digital input x6, as desired.

The analog output signal in the next time slot T is obtained via the following process. The sum of DAC A to DAC D at the first time slot T of y7 is given by:

$$y7+y5+y6+y4=\mathrm{mod}(x7-(y5+y6+y4))+y5+y6+y4$$

If a modulo operation is applied on the analog signal, the analog output would be:

$$\mathrm{mod}(y7+y5+y6+y4)=\mathrm{mod}(\mathrm{mod}(x7-(y5+y6+y4))+y5+y6+y4)=x7$$

Thus, the analog output is equivalent to the digital input x7, as desired.

As shown above, after a modulo operation at 703 is applied, the analog output of the sum of DAC A to DAC D reflects the full values of the digital 8-bit inputs x (701 in FIG. 7). Since a modulo operation is difficult to apply on an analog signal, embodiments of the present disclosure provide a mechanism to achieve the similar effect by applying the modulo operation in the digital domain. This can be done via 9 DACs: DAC1 to DAC9, as is explained below.

Figure 9:
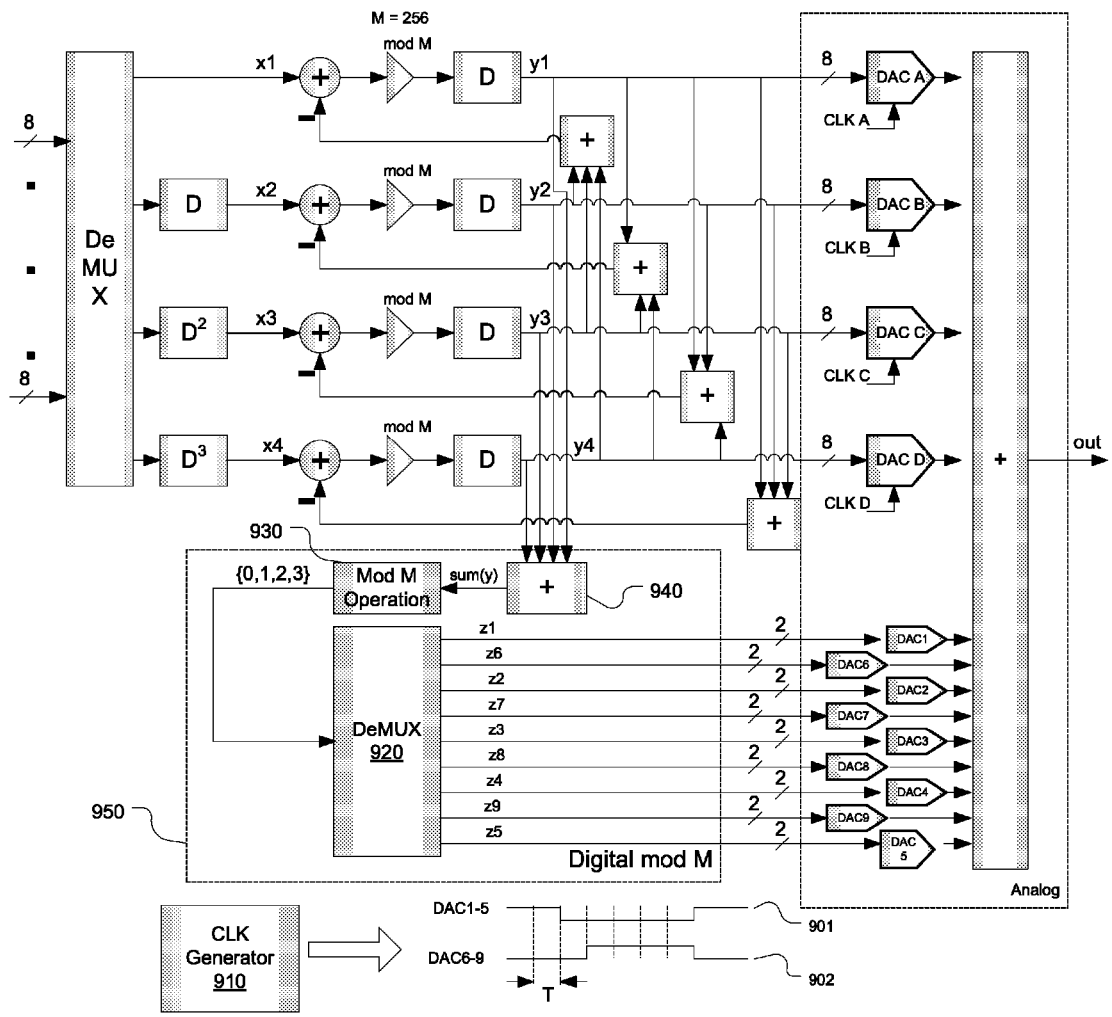
FIG. 9 illustrates the configuration of an exemplary interleaved DAC including an exemplary restoration logic capable of applying modulo operations in the digital domain and thereby restoring the original values represented by the first digital inputs in accordance with an embodiment of the present disclosure.
Figure 10:
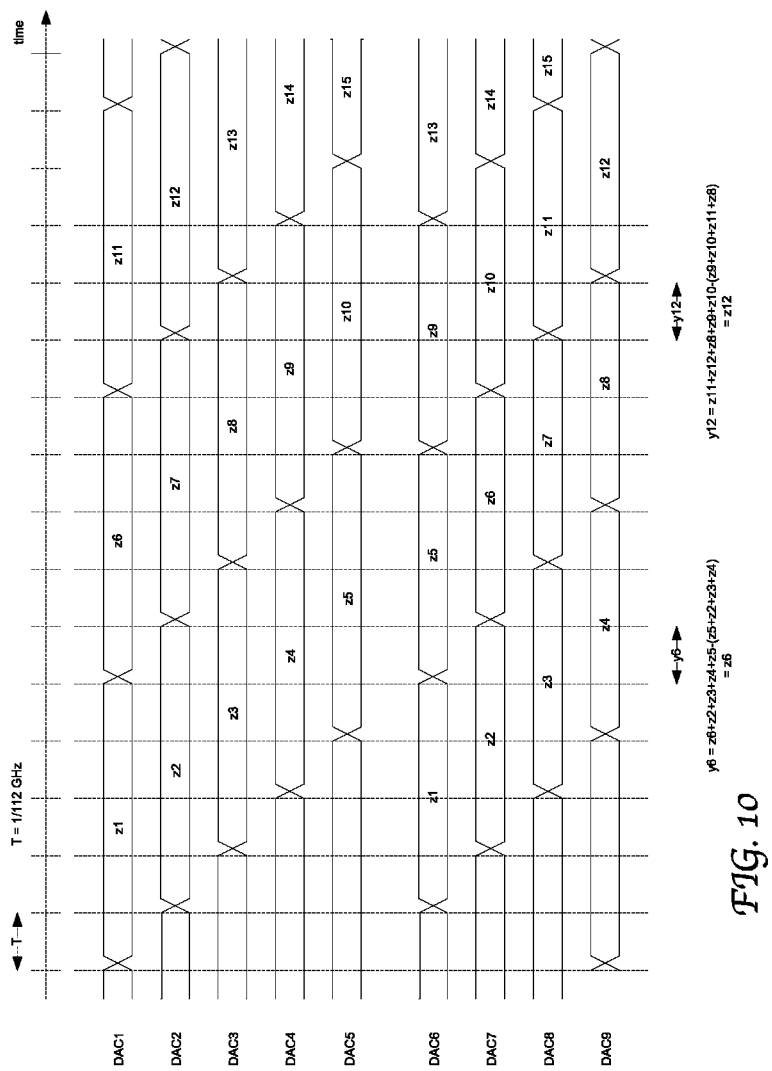
FIG. 10 illustrates the timing diagrams of the digital inputs z1-z12 supplied to respective sub-DACs in the restoration logic as shown in FIG. 9.

FIG. 9 illustrates the configuration of an exemplary interleaved DAC 900 including an exemplary restoration logic 950 capable of applying modulo operations to restore the full values of the digital inputs in the digital domain in accordance with an embodiment of the present disclosure. FIG. 10 illustrates the timing diagrams of the digital inputs z1-z12 supplied to respective sub-DACs in the restoration logic as shown in FIG. 9.

The interleaved DAC 900 includes the same components as shown in FIG. 7 and additionally includes modulo restoration logic 950. The restoration logic 950 is used to reverse the effects of the modulo operations at 751-755 by adding the quotient portions with the outputs from the first sub-DACs. Thereby the resultant analog signal of the interleaved DAC represents full analog values of the first digital inputs.

More specifically, the restoration logic 950 includes a modulo operator 930 configured to apply a modulo operation on a sum of the 4 digital inputs to DAC A-DAC D (y signals) by using M as divisor. The modulo operator 903 performs a subtraction of one of the 4 possible values: 256×i, where i=0, 1, 2, 3, namely, 0, 256, 512, or 768. Thus, every time slot T, there is a digital signal that can get one out of the quotients values {0, 1, 2, 3}.

To convert the digital signal representing the quotients to an analog signal and subtract it in the analog domain, a demultiplexer 920, a set of negative sub-DACs (DAC1-DAC5) and a set of positives sub-DACs (DAC6-DAC9) are used. The two sets of sub-DACs (DAC1-DAC9) are configured and arranged a similar manner as the sub-DACs DAC1-DAC9 described with reference FIGS. 3-6, but with the differences that (1) the sub-DAC inputs in the restoration logic are 2 bits only and (2) the output of the 2-bit sub-DACs need a multiplication by 256. This can be done via a proper setting of the DAC reference signal in any suitable manner that is well known in the art.

Modulo of M is applied to the sum signal to produce a quotient signal which is then demultiplexed into 2 sets of signals, 5 negative digital signals and 4 positive digital signals, for supply to respective sub-DACs (DAC1-DAC9). The 9 inputs signals to the 9 sub-DACs are denoted as z1 to z9 in FIG. 9-10. Here there are 5 2-bit DACs, DAC1 to DAC5, with possible negative outputs of −256*i, i=0 to 3, and 4 2-bit DACs, DAC6 to DAC9, with possible positive outputs of 256*i, i=0 to 3. As shown in 901 and 902, the clocks to DAC1 to DAC5 has a frequency of $f_s/5$, where $f_s$=112 GHz, and DAC6 to DAC9 have clocks with a frequency of $f_s/4$. The clocks are offset in phase T, where the clock to DAC2 is delayed by T relative to the clock to DAC1, where T=1/112 GHz.

Each positive digital input is supplied to a positive sub-DAC for conversion, and the corresponding negative digital input is supplied to a negative sub-DAC for conversion. The clock signal of a positive sub-DAC (e.g., DAC6) is delayed by a phase of $T=1/f_s$ compared with that of the corresponding negative sub-DAC (e.g., DAC1). Responsive to a same data point in the quotient signal, the negative sub-DAC (e.g., DAC1) produces a negative analog output, and the positive sub-DAC (e.g., DAC 6) produces a positive analog output of the same magnitude. Further, the clock signals for two positive sub-DACs configured to convert two consecutive digital points are offset by the phase of $T=1/f_s$; and the clock signals for two negative sub-DACs configured to convert two consecutive data points are offset by the same phase of $T=1/f_s$.

Responsive to a data point in the quotient signal, each negative sub-DAC operates to perform the conversion and drive its analog output for a duration of $(R+1)\times T=(R+1)/f_s$; and each positive sub-DAC operates to drive its analog output responsive to the quotient data point for a duration of $R\times T=R/f_s$. Thus, a negative sub-DAC drives a data point for a duration $(R+1)\times T$, during which time the corresponding positive sub-DAC removes this data point at the output of the restoration logic for a duration of $R\times T$. As such, by combining the analog outputs of both subsets of sub-DACs, a particular output from a negative sub-DAC is removed by subtraction from the combined analog output when it is no longer needed at the output of the restoration logic. As a result, the combined analog output has each data point valid only for a duration of T and then the next data point emerges, thereby achieving the desired data conversion speed of $f_s=1/T$ at the restoration logic.

Further, in this configuration, the outputs of the restoration logic are synchronized with the outputs of the first sub-DACs. By combining all the outputs of the first sub-DACs, the positive sub-DACs and the negative sub-DACs, a resultant analog output of the interleaved DAC is obtained. Each data point in the resultant analog output holds for a duration of T and represents the analog value of a corresponding first digital input.

Figure 11:
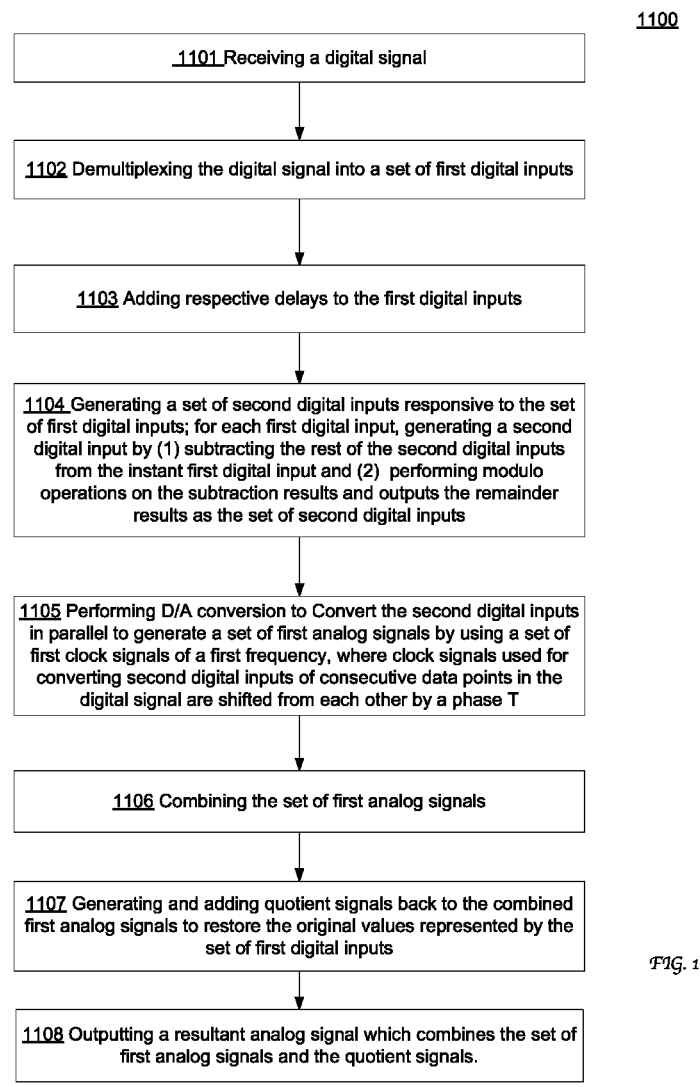
FIG. 11 is a flow chart depicting an exemplary process of interleaved digital-to-analog conversion without return-to-zero in accordance with an embodiment of the present disclosure.

FIG. 11 is a flow chart depicting an exemplary process 1100 of interleaved digital-to-analog conversion without return-to-zero in accordance with an embodiment of the present disclosure. Process 1100 may be performed by the exemplary interleaved DACs presented in FIGS. 7 and 9 or any other suitable implementation in hardware, software or a combination thereof.

At 1101, a digital signal is received at the interleaved DAC and demultiplexed into a set of first digital inputs at 1102. At 1103, different delays are added to the first digital inputs such that the digital inputs (second digital inputs) to the sub-DACs follow a timing schedule as shown in FIG. 8. At 1104, a set of second digital inputs are generated responsive to the set of first digital inputs. For each first digital input, a second digital input is generated by (1) subtracting the rest of the second digital inputs from the instant first digital input and (2) using $M=2^n$ as the divisor to perform modulo operations on the subtraction results and outputs the remainders as the set of second digital inputs.

At 1105, D/A conversion is performed to convert the second digital signals in parallel to generate a set of first analog signals by using a set of first clock signals of a first frequency ($f_s/R$). Two first clock signals respectively used for converting two consecutive second digital inputs (corresponding to consecutive data points in the digital input signal) are shifted from each other by a first phase $T=1/f_s$.

At 1106, the set of first analog signals are combined, e.g., added together. At 1107, quotient signals are generated and added back to the combined first analog signals to restore the full values represented by the set of first digital inputs. At 1108, a resultant analog signal is output which combines the set of first analog signals and the quotient signals, and thus represents the digital input signal received at 1101 in the analog domain.

Figure 12:
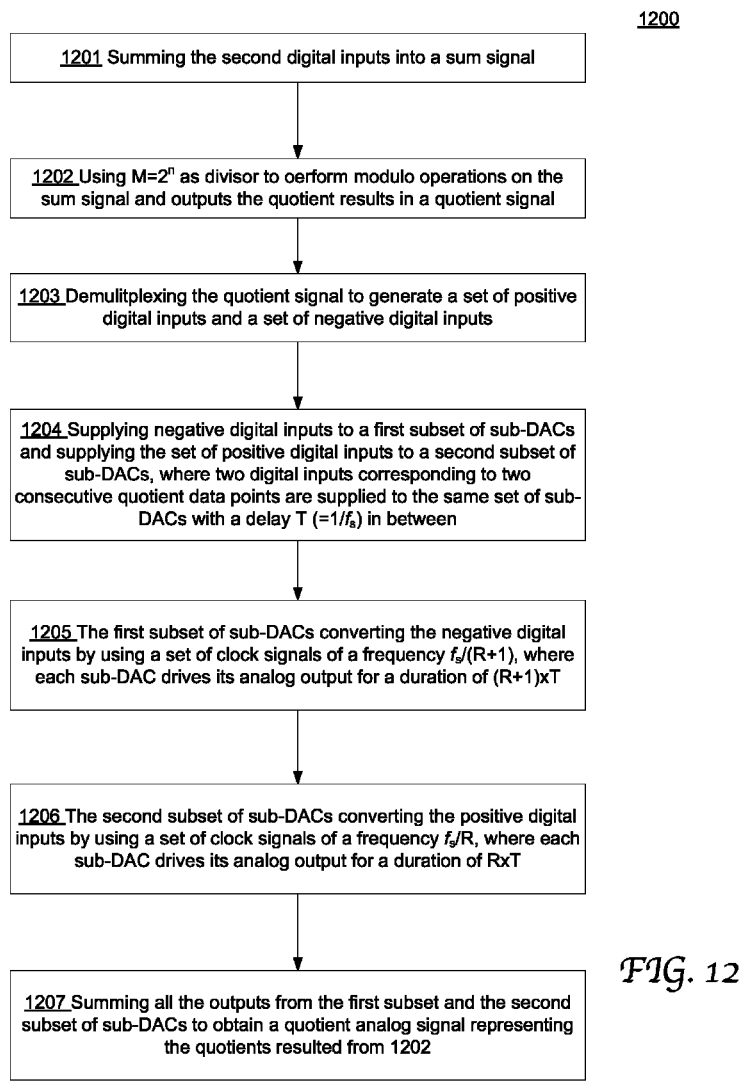
FIG. 12 is a flow chart depicting an exemplary process of generating quotient values to restore the original values of the first digital inputs at the output of the interleaved digital-to-analog conversion without return-to-zero in accordance with an embodiment of the present disclosure.

FIG. 12 is a flow chart depicting an exemplary process 1200 of restoring quotient values in interleaved digital-toanalog conversion without return-to-zero in accordance with an embodiment of the present disclosure. Process 1200 may be performed by the exemplary restoration logic presented in FIGS. 7 and 9 as well as any other suitable implementation in hardware, software or a combination thereof.

At 1201, the second digital inputs are added together into a sum signal. At 1202, $M=2^n$ is used as divisor to perform modulo operations on the sum signal and outputs a quotient signal representing a sequence of quotient results from the modulo operations. At 1203, the quotient signal is demultiplexed to generate a set of negative digital inputs and a set of positive digital inputs.

At 1204, the positive digital inputs are supplied to a first subset of sub-DAC. In parallel, the negative digital inputs are supplied to a second subset of sub-DACs. Each two consecutive digital inputs are supplied to the same set of sub-DACs with a delay T ($=1/f_s$) in between.

At 1205, the first subset of sub-DACs convert the positive digital inputs by using a set of clock signals of a first frequency $f_s/R$, where each sub-DAC drives its analog output for a duration of R×T. At 1206, the second subset of sub-DACs convert the negative digital inputs by using a set of clock signals of a second frequency $f_s/(R+1)$, where each sub-DAC drives its analog output for a duration of (R+1)×T.

At 1207, all the outputs from the first subset and the second subset of sub-DACs are added together to obtain a quotient analog signal representing the quotients resulted from 1202. At each time slot T, the combined quotient signal corresponds to one quotient data point resulted from 1202. The quotient analog signal is then combined with the outputs of the first sub-DACs to produce a resultant analog signal at the output of the interleaved DAC.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method of digital-to-analog signal conversion, said method comprising:
   generating a set of first digital inputs based on a digital signal;
   generating a set of second digital inputs responsive to said set of first digital inputs, wherein said generating a set of second digital inputs comprises generating a respective second digital input by generating a subtraction signal by subtracting a sum of remaining second digital inputs of said set of second digital inputs from a corresponding first digital input of said set of first digital inputs;
   converting said set of second digital inputs in parallel to generate a set of first analog signals, wherein said converting is based on a set of first clock signals of a first frequency, and wherein further two first clock signals respectively used for converting two consecutive second digital inputs to corresponding first analog signals are shifted from each other by a first phase, wherein said two consecutive second digital inputs correspond to consecutive data points in said digital signal; and
   combining said set of first analog signals; and
   generating a resultant analog signal based on said combining.

2. The method of claim 1, wherein said generating said set of first digital inputs comprises:
   demultiplexing said digital signal into a set of third digital inputs; and
   adding respective delays to said set of third digital inputs to generate said set of first digital inputs, wherein a delay added to a respective third digital input is greater than a delay added to an adjacent third digital input by said first phase.

3. The method of claim 1, wherein said generating said set of second digital inputs further comprises:
   performing first modulo operations on subtraction signals; and
   supplying remainder outputs from said first module operations as said set of second digital inputs, and wherein said respective second digital input is delayed in said first phase in relation to said corresponding first digital input.

4. The method of claim 1, wherein said first frequency equals $f_s/R$, wherein $f_s$ equals an effectively frequency of converting said digital signal to said resultant analog signal, wherein said first phase equals $1/f_s$, wherein each of said set of first analog signals sustains for a duration of $R/f_s$, and wherein further R equals to a number of said set of first digital inputs.

5. The method of claim 3, wherein a divisor in said first modulo operation corresponds to a maximum digital input of a converter used for converting said respective second digital input to an analog signal of said set of first analog signals.

6. The method of claim 3 further comprising:
   determining quotients resulting from first modulo operations; and
   generating second analog signals represented by said quotients, wherein said generating said resultant analog signal comprises combining said second analog signals with said set of first analog signals.

7. The method of claim 3 further comprising:
   summing said set of second digital inputs to produce a sum signal;
   performing second modulo operations on said sum signal to produce a quotient signal representing a set of quotients resulted from said second modulo operations;
   converting said set of quotients to a set of second analog signals through digital-to-analog conversion; and
   combining said set of second analog signals with said set of first analog signals to produce said resultant analog signal.

8. The method of claim 7, wherein said converting said set of quotients comprises:
   demulitplexing said quotient signal;
   converting said set of quotients to a first subset of said set of second analog signals in parallel by using a set of second clock signals of a second frequency that is different from said first frequency; and
   in parallel with converting said set of quotients to said first subset of said set of second analog signals, converting said set of quotients to a second subset of said set of second analog signals in parallel by using a set of third clock signals of said first frequency, and wherein further said first subset of said set of second analog signals represent negative values of said second subset of said set of second analog signals.

9. The method of claim 8, wherein a ratio of said first frequency to said second frequency is (R+1)/R, wherein R is an integer greater than 1.

10. The method of claim 8, wherein each of said first subset of said set of second analog signals sustains for a duration of $(R+1)/f_s$, and wherein further each of said second subset of said set of second analog signals sustains for a duration of $R/f_s$.

11. A digital-to-analog converter (DAC) comprising:
an interface configured to receive a digital signal; and
an interleaved Digital-to-Analog Converter (DAC) coupled to said interface and configured to convert said digital signal into a resultant analog signal in an effective frequency of $f_s$, wherein said interleaved DAC comprises:
  a demulitplexer configured to demultiplex said digital signal into a set of first digital inputs;
  first logic configured to generate a set of second digital inputs, wherein said first logic comprises second logic configured to generate subtraction signals responsive to said set of first digital inputs, wherein each subtraction signal is generated by subtracting a sum of said set of second digital inputs less a respective second digital input from a corresponding first digital input of said set of first digital inputs;
  a set of first sub-DACs configured to convert said set of second digital inputs in parallel to generate a set of first analog signals based on a set of first clock signals of a first frequency, and wherein further two first clock signals respectively used for converting two consecutive second digital inputs to corresponding first analog signals are shifted from each other by a first phase; and
  an output configured to: combine said set of first analog signals; and output a resultant analog signal based on a combination of said set of first analog signals.

12. The DAC of claim 11, wherein said interleaved DAC further comprises:
first delay units coupled between said demultiplexer and said first logic and configured to add respective delays to said first digital inputs; and
second delay units configured to respectively delay second digital inputs by T in relation to corresponding first digital inputs.

13. The DAC of claim 11, wherein said second logic comprises first adders, and wherein said first logic further comprises first modulo operators coupled to said first adders and configured to perform first modulo operations on subtraction signals output from said first adders.

14. The DAC of claim 13, wherein said first logic further comprises registers configured to store and supply remainder outputs from said first module operators as said set of second digital inputs.

15. The DAC of claim 11, wherein said first frequency equals $f_s/R$, wherein $f_s$ equals an effectively frequency of converting said set of second digital inputs to said resultant analog signal, wherein said first phase equals $1/f_s$, wherein each of said set of first analog signals sustains for a duration of $R/f_s$, and wherein further R equals to a number of said set of first digital inputs.

16. The DAC of claim 13 further comprising third logic comprising:
a second adder configured to sum said set of second digital inputs into a sum signal;
a second modulo operator configured to perform modulo operations on said sum signal; and
a demultiplexer coupled to said second modulo operator and configured to generate third digital inputs representing quotient outputs from said second modulo operators, and
a set of second sub-DACs configured to convert said third digital inputs to second analog signals in parallel, and wherein said output is further configured to combine said second analog signals with said combination of said set of first analog signals.

17. The DAC of claim 16, wherein said set of second sub-DACs comprises a first subset of second sub-DACs and a second subset of sub-DACs, wherein each of said first subset of second sub-DACs is coupled to receive a set of second clock signals of a second frequency, wherein each of said second subset of second sub-DACs is coupled to receive a set of third clock signals of said first frequency, and wherein further analog outputs from said second subset of second sub-DACs represent negative values of analog outputs from said first subset of second sub-DACs.

18. The DAC of claim 17, wherein a ratio of said first frequency to said second frequency is $(R+1)/R$, and wherein further said first subset comprises R+1 second sub-DACs and said second subset comprises R second sub-DACs.

19. The DAC of claim 17, wherein each analog output from a second sub-DAC in said first subset sustains for a duration of $(R+1)/f_s$, and wherein further each analog output from a second sub-DAC in said second sustains for a duration of $R/f_s$.

20. The DAC of claim 11 further comprising a clock generation unit configured to generate said set of first clock signals, and wherein each pulse of each first clock signal sustains for a duration of $R/f_s$, wherein R equals to a number of said set of first sub-DACs.

* * * * *